United States Patent
Yano

(10) Patent No.: US 9,230,862 B2
(45) Date of Patent: Jan. 5, 2016

(54) WAFER DIE SEPARATION

(71) Applicant: Texas Instruments Incorporated, Dallas, TX (US)

(72) Inventor: Genki Yano, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 214 days.

(21) Appl. No.: 13/894,177

(22) Filed: May 14, 2013

(65) Prior Publication Data

US 2014/0339672 A1      Nov. 20, 2014

(51) Int. Cl.
*H01L 21/683* (2006.01)
*H01L 21/78* (2006.01)
*H01L 21/687* (2006.01)
*H01L 21/67* (2006.01)

(52) U.S. Cl.
CPC ............ *H01L 21/78* (2013.01); *H01L 21/6836* (2013.01); *H01L 21/67* (2013.01); *H01L 21/683* (2013.01); *H01L 21/6835* (2013.01); *H01L 21/68721* (2013.01); *H01L 21/68735* (2013.01); *H01L 2221/68336* (2013.01)

(58) Field of Classification Search
CPC .............................. H01L 21/67; H01L 21/687
See application file for complete search history.

(56) References Cited

U.S. PATENT DOCUMENTS

| | | | |
|---|---|---|---|
| 4,140,260 A * | 2/1979 | Gantley | 225/93 |
| 6,344,402 B1 | 2/2002 | Sekiya | |
| 2006/0005911 A1 * | 1/2006 | Kubo et al. | 156/84 |
| 2010/0289159 A1 | 11/2010 | Okamoto et al. | |

OTHER PUBLICATIONS

Shoichi, Iriguchi; Kengo, Aoya; Genki, Yano; Kazunori, Hayata, U.S. Appl. No. 13/894,191, filed May 14, 2013 for "Wafer Processing", 24 pages.

* cited by examiner

*Primary Examiner* — William Harriston
(74) *Attorney, Agent, or Firm* — Steven A. Shaw; Charles A. Brill; Frank D. Cimino

(57) ABSTRACT

A method of separating dice of a singulated wafer that is supported on a dicing tape sheet is disclosed. The method may include attaching the dicing tape sheet to a ring frame; relatively raising a portion of the dicing tape sheet supporting the wafer with respect to the ring frame; and attaching support tape to the ring frame and the dicing tape sheet.

9 Claims, 7 Drawing Sheets

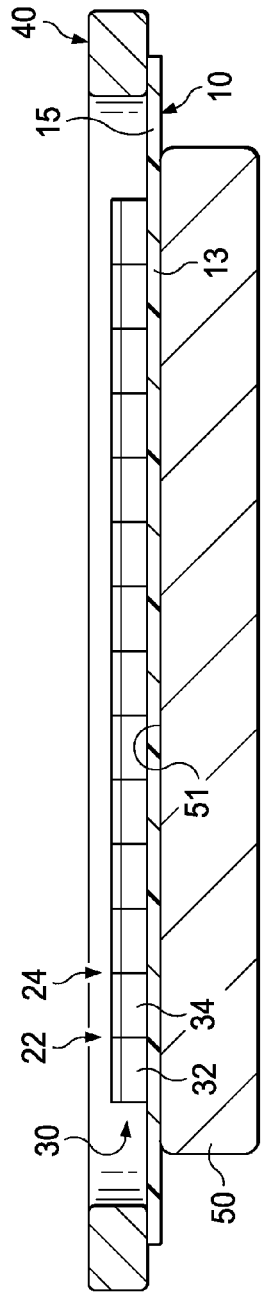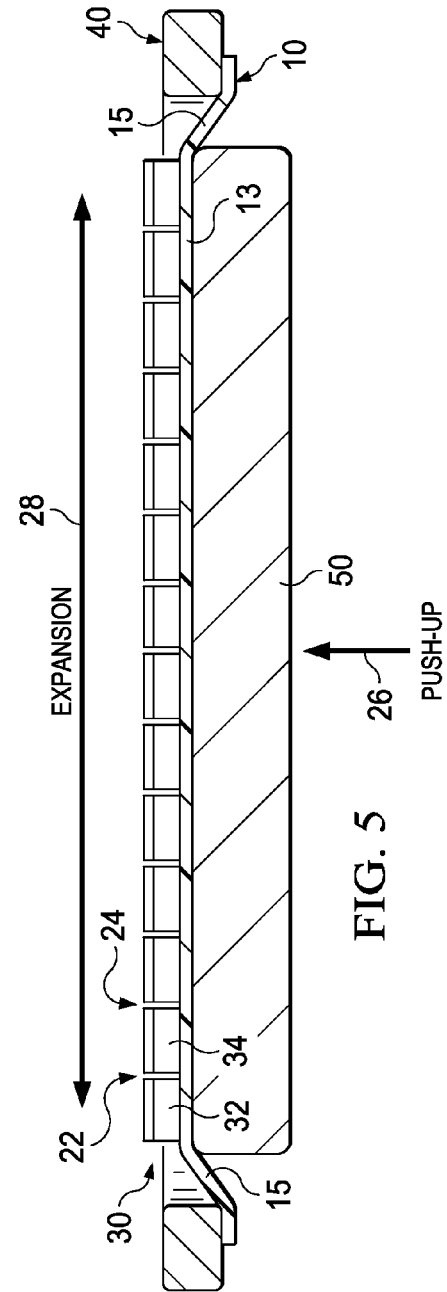

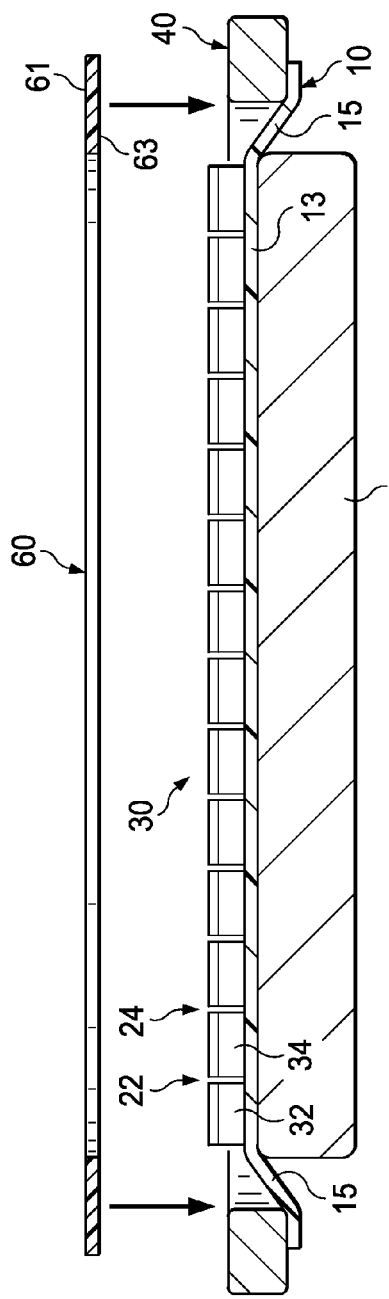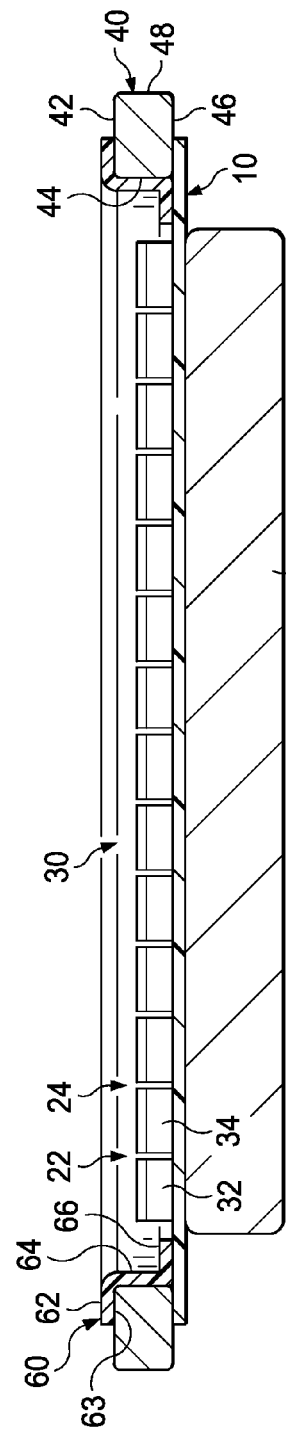

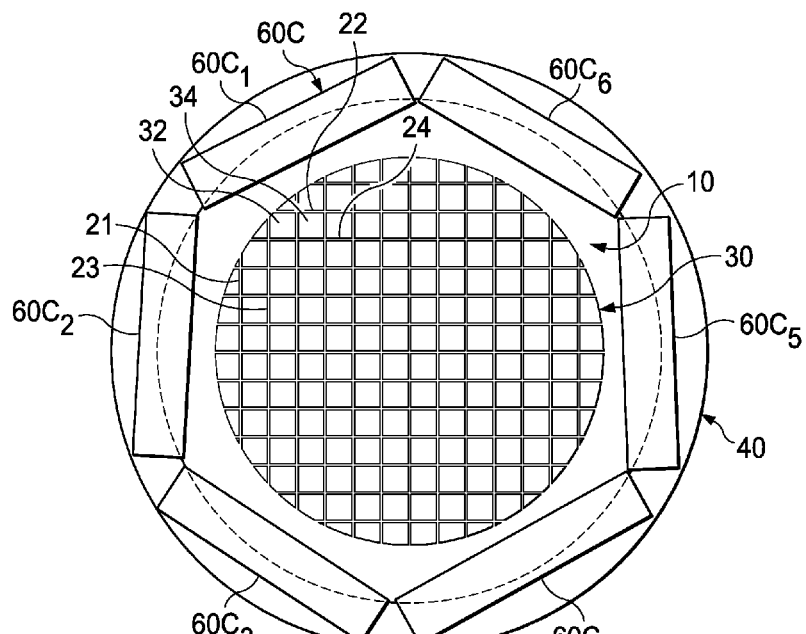
FIG. 12
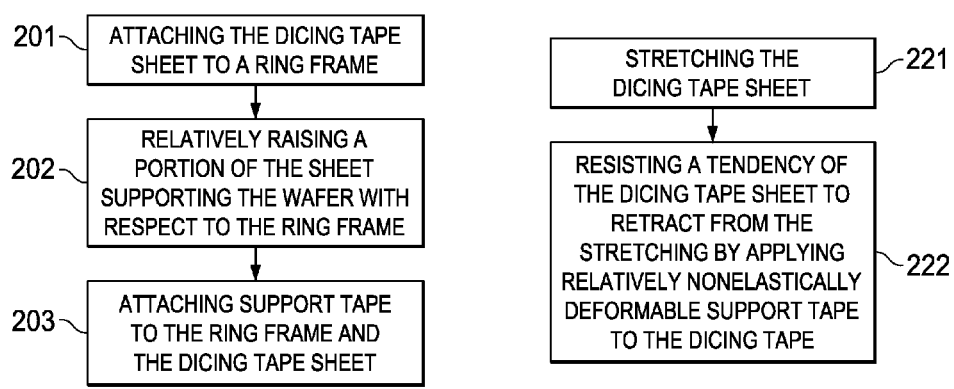
FIG. 13
FIG. 14

… (1)

WAFER DIE SEPARATION

BACKGROUND

Integrated circuit "dies" or "dice" are small cubes of semiconductor material such as silicon that have various interconnected electrical circuits formed therein. Each die typically has a metalized surface layer with electrical contact regions thereon that allows the die to be connected to other electronic components. Integrated circuit dice are produced by "singulating" ("dicing") a unitary semiconductor wafer having identical circuits formed in adjacent regions thereof that are arranged in a rectangular generally waffle-shaped grid. Saw cuts or laser fractures are made along "saw streets" to cut the wafer into dice. A diced wafer is often supported on a deformable sheet known as dicing tape. The dicing tape may be stretched by force applied to its outer perimeter. Stretching the dicing tape causes the diced wafer supported on it to expand laterally, thereby separating the dice. The separated dice may then be picked up, one at a time, by pick and place machines or the like. With very small dice, i.e., less than about 1.0 mm, current methods of expanding the dicing tape tend to provide insufficient space between dice, or the space provided shrinks sufficiently after initial expansion, such that handling of the dice is difficult and often ends with damage to adjacent dice.

BRIEF DESCRIPTION OF THE DRAWING

FIG. 4 is a schematic cross sectional elevation view of a wafer support table, dicing tape sheet, wafer and ring frame with the wafer in an unseparated state.

FIG. 5 is a schematic cross sectional elevation view of a wafer support table, dicing tape sheet, wafer and ring frame with the wafer support table raised relative to the ring frame and with the dicing tape sheet stretched and with the wafer in an expanded state.

FIG. 6 is a schematic cross sectional elevation view of the wafer support table, dicing tape sheet, wafer and ring frame in the state illustrated in FIG. 5 and further showing a support tape ring just prior to application thereof.

FIG. 7 is a schematic cross sectional elevation view of the wafer support table, dicing tape sheet, wafer and ring frame of FIG. 6, with the support tape ring applied to the ring frame and dicing tape sheet and with the wafer support table lowered relative to the ring frame.

FIG. 12 is a top plan view of still another embodiment of dicing tape sheet, wafer, ring frame and support tape in which chord wise extending strips of support tape are used.

FIG. 13 is a flow chart of a method of separating dice of a singulated wafer that is supported on a dicing tape sheet.

FIG. 14 is a flow chart of a method of separating dice of a singulated wafer that is supported on a relatively elastically deformable dicing tape sheet.

DETAILED DESCRIPTION

Figure 1:
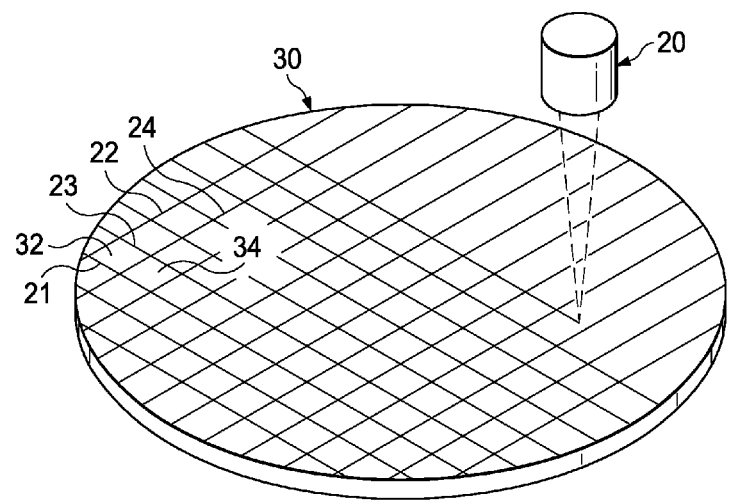
FIG. 1 is a schematic top isometric view of a wafer, illustrating singulation thereof with a stealth laser.

In general, this specification discloses, as illustrated by FIGS. 4-8 and 13, a method of separating dice 32, 34 of a singulated wafer 30 that is supported on a dicing tape sheet 10. The method includes attaching the dicing tape sheet 10 to a ring frame 40, as shown at block 201 of FIG. 13. The method also includes, as shown at block 202 of FIG. 13, relatively raising a portion 13 of the dicing tape sheet 10 supporting the wafer with respect to the ring frame 40. The method further includes attaching support tape 60 to the ring frame 40 and the dicing tape sheet 10, as shown at block 203 of FIG. 13.

FIG. 1 is a schematic top isometric view of a wafer 30, illustrating singulation thereof with a stealth laser 20. The stealth laser 20, produces fractures in the wafer that form a plurality of singulation lines 21, 22, 23, 24, etc. that form a rectangular grid and divide the wafer 30 into a plurality of dies or dice 32, 34, etc. The wafer 30 may instead be singulated by saw cutting. Both stealth laser and saw cutting singulation are now in the art and are thus not further discussed herein.

Figure 2:
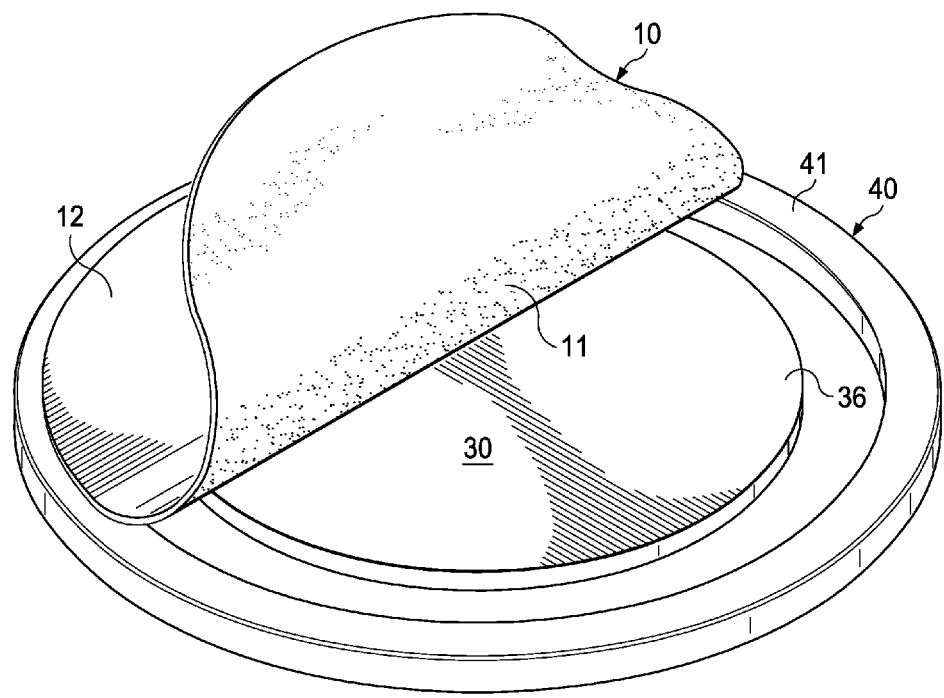
FIG. 2 is a schematic bottom isometric view of a wafer, illustrating mounting of a dicing tape sheet and ring frame.
Figure 3:
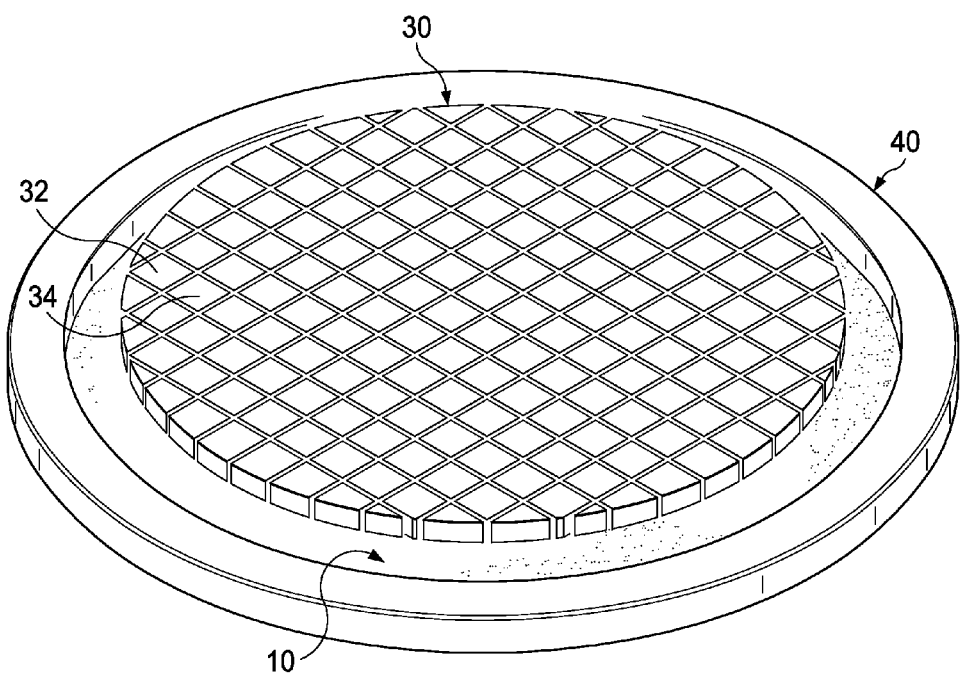
FIG. 3 is a schematic top isometric view of a wafer, dicing tape sheet and ring frame.

FIG. 2 is a schematic bottom isometric view of a wafer, illustrating mounting of a generally circular dicing tape sheet 10 on a back surface 36 of the wafer 30. The dicing tape sheet 10 has a tacky top surface 11 that is attached to the back surface 36 of the wafer 30. The dicing tape sheet 10 has a non-tacky bottom surface 12. A ring frame 40 is attached at a bottom surface 41 thereof to the tacky top surface 11 of the dicing tape sheet 10 at its periphery. Thus an assembly is formed as illustrated in FIG. 3 in which a generally circular wafer 30 is supported on a generally circular dicing tape sheet 10. Both the wafer 30 and most of the circular dicing tape sheet 10 are circumscribed by the ring frame 40. Such an assembly is known in the art.

As illustrated by FIG. 4, the assembly of FIG. 3 may be positioned on a generally flat top surface 51 of a support table 50, such that the table top surface 51 is below a portion 13 of the dicing tape sheet 10 that supports the wafer 30 and associated dice 32, 34. An outer annular portion 15 of the dicing tape sheet 10 that extends out in coplanar relationship with portion 13 and the ring frame 40 are not supported by the table top surface 51. An alternate support such as a support ring/stand (not shown) or a human hand (not shown) may support the ring frame 40 and dicing tape sheet portion 15.

Next, as illustrated by FIG. 5, the table 50 is raised relative to the ring frame 40. As a result the entire dicing tape sheet 10 is stretched radially and, as a result, the dice 32, 34 mounted on inner dicing tape sheet portion 13 are radially spread apart. In other words, the singulation lines 21, 22, 23, 24, etc. become wider. In one embodiment the width of each singulation lines 21, 22, 23, 24, etc. is about 0.020 mm or more after the expansion shown in FIG. 5.

Figure 8:
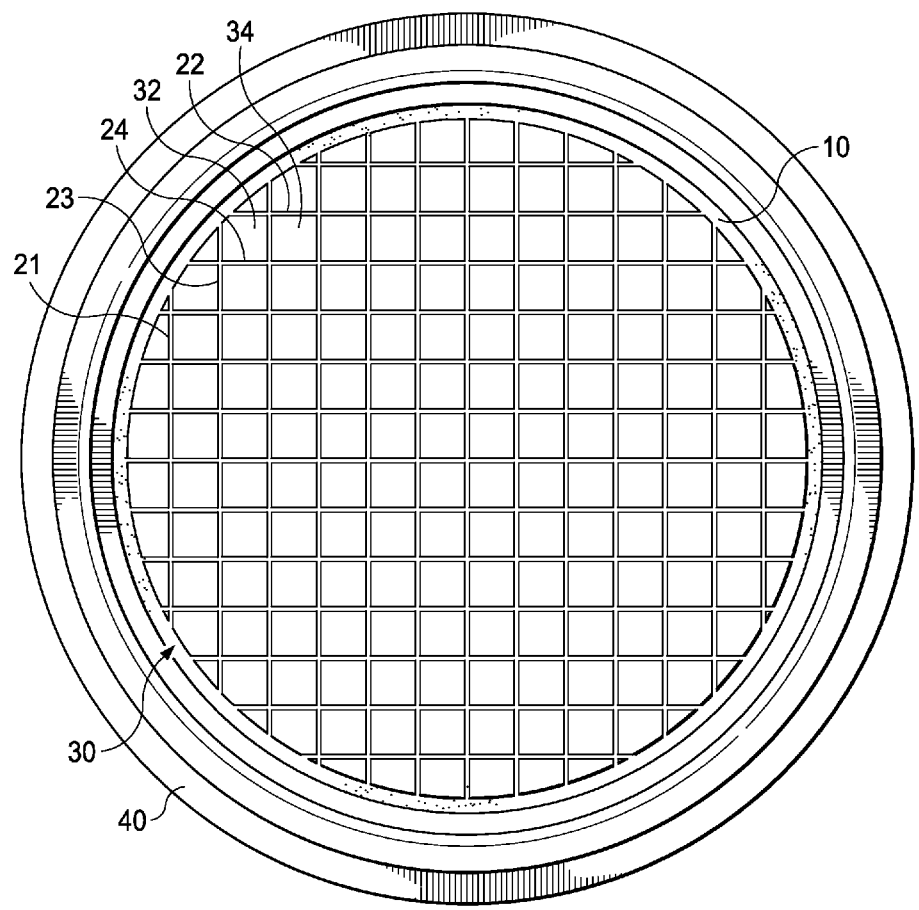
FIG. 8 is a top plan view of the dicing tape sheet, wafer, ring frame and support tape in the state illustrated in FIG. 7.
Figure 9:
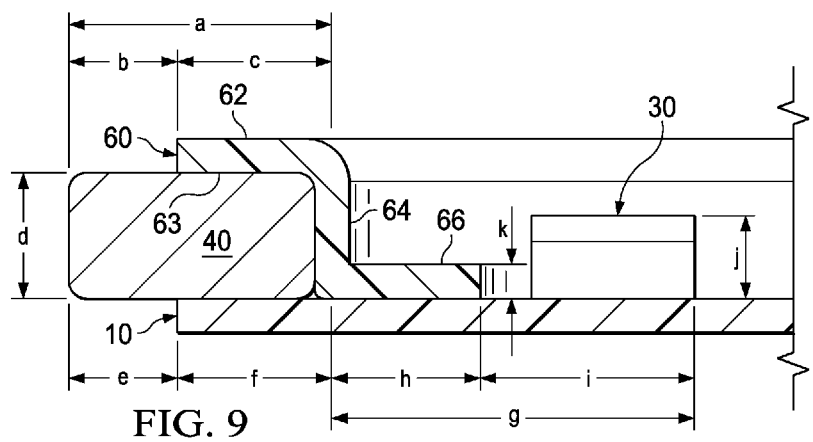
FIG. 9 is a detail view of the assembly of FIG. 7.

As shown by FIG. 6, a ring of support tape 60 is then positioned over the ring frame 40 and an annular part of the outer annular portion 15 of the dicing tape sheet 10. The support tape has a smooth, non-tacky surface 61 and a tacky surface 63. The tacky surface 63 of the support tape 60 is then pressed onto the ring frame 40 and the dicing tape sheet 10 when they are positioned as shown in FIG. 6. The table 50 is then raised relative to the ring frame 40 so that the dicing tape sheet 10 is returned to a generally planar configuration as shown in FIGS. 7 and 8. Dimensional parameters of the ring frame 40, support tape 60, dicing tape sheet 10 and the wafer are illustrated in FIG. 9. In one nonlimiting embodiment these parameters may have the following values: a=15.0 mm, b=5.0 mm, c=10.0 mm, d=1.6 mm, e=5.0 mm, f=10.0 mm, g=23.0 mm, h=10.0 mm, i=13.0 mm, j=0.050 mm to 0.900 mm, and k=0.180 mm. The thickness of the dicing tape may be 0.09 mm. It will be understood that these dimensions are only provided to give the reader a relative sense of scale for one typical embodiment. These dimensions will of course vary with wafers of different diameters and thicknesses and with different types of singulation and with different sizes and materials used for the dicing tape sheet and the support tape. In some embodiments the dicing tape sheet is made from relatively stretchable (elastic) material, such as polyvinyl chloride (PVC) or polyolefin (PO) and the support tape is made from relatively nonstretchable (inelastic) material such as polyethylene terephthalate (PET).

Figure 10:
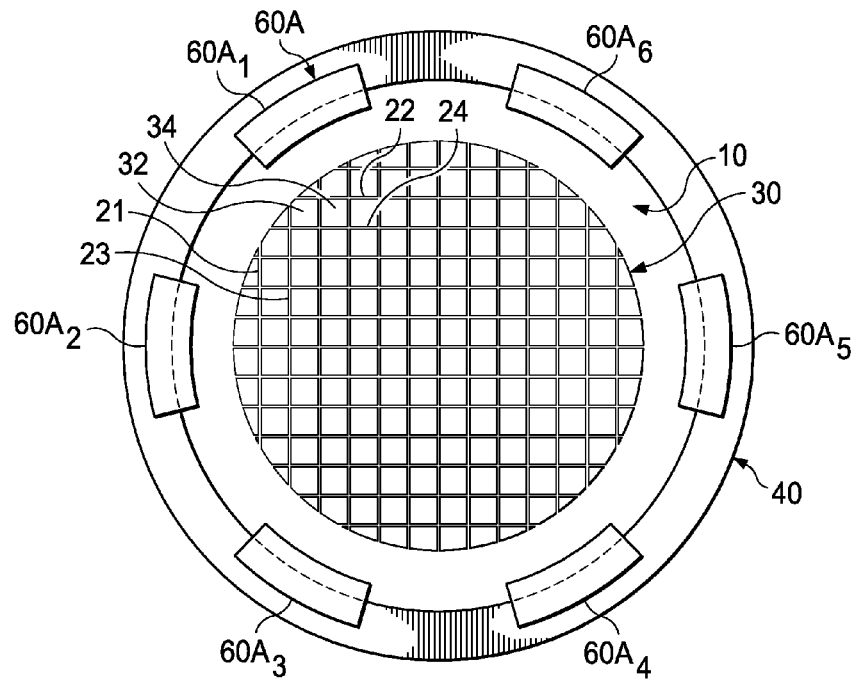
FIG. 10 is a top plan view of an another embodiment of dicing tape sheet, wafer, ring frame and support tape in which circumferentially extending strips of support tape are used.

FIG. 10 is a top plan view of an another embodiment of dicing tape sheet 10, wafer 30, ring frame 40 and support tape 60A in which a plurality of circumferentially (arcuately) extending support tape strips $60A_1$, $60A_2$, $60A_3$, etc. are attached to the dicing tape sheet 10 and the ring frame 40 to prevent inward retraction of the dicing tape 10 and an associated reduction in width of the spaces 21, 22, 23, 24, etc., between dice 32, 34, etc.

Figure 11:
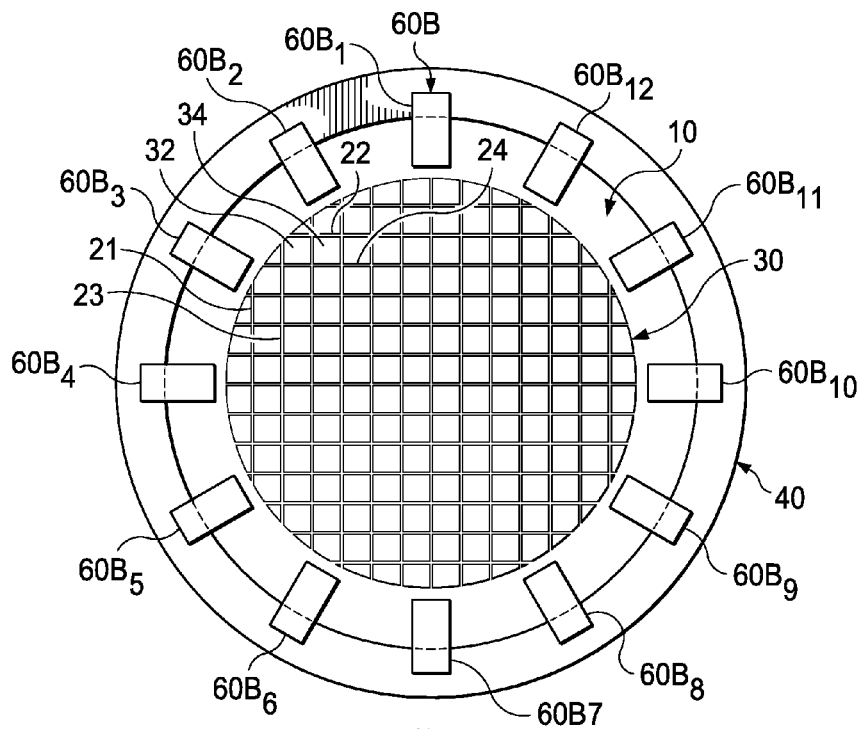
FIG. 11 is a top plan view of still another embodiment of dicing tape sheet, wafer, ring frame and support tape in which radially extending strips of support tape are used.

FIG. 11 is a top plan view of an another embodiment of dicing tape sheet 10, wafer 30, ring frame 40 and support tape 60B in which a plurality of radially extending support tape strips $60B_1$, $60B_2$, $60B_3$, etc., are attached to the dicing tape sheet 10 and the ring frame 40 to prevent inward retraction of the dicing tape 10 with an associated reduction in width of the spaces 21, 22, 23, 24, etc., between dice 32, 34, etc.

FIG. 12 is a top plan view of an another embodiment of dicing tape sheet 10, wafer 30, ring frame 40 and support tape 60C in which a plurality of chord wise extending support tape strips $60C_1$, $60C_2$, $60C_3$, etc., are attached to the dicing tape sheet 10 and the ring frame 40 to prevent inward retraction of the dicing tape 10 with an associated reduction in width of the spaces 21, 22, 23, 24, etc., between dice 32, 34, etc.

In each of the above discussed embodiments the support tape 60 will reduce the amount of radial inward creep or inward retraction that the dicing tape sheet 10 would undergo without the support tape 60. As a result, individual dies 32, 34, etc. may be picked up with a conventional pick and place machine (not shown) without damaging adjacent dice.

FIG. 14 discloses a method of separating dice of a singulated wafer that is supported on a relatively elastically deformable dicing tape sheet. The method includes, as shown at block 221, stretching the dicing tape sheet. The method further includes, as shown at block 222, resisting a tendency of the dicing tape sheet to retract from said stretching by applying relatively nonelastically deformable support tape to the dicing tape.

Certain methods of separating dice of a singulated wafer and associated apparatus are expressly disclosed in detail herein. Various alternative embodiments of such methods and apparatus will occur to those skilled in the art after reading this disclosure. The appended claims are intended to be broadly construed so as to cover such alternative embodiments, except as limited by the prior art.

What is claimed is:

1. A method of separating dice of a singulated wafer that is supported on a dicing tape sheet comprising:
attaching the dicing tape sheet to a ring frame;
relatively raising a portion of the sheet supporting the wafer with respect to the ring frame; and
attaching support tape to the ring frame and the dicing tape sheet comprising attaching a plurality of radially extending strips of support tape to the ring frame and the dicing tape sheet.

2. A method of separating dice of a singulated wafer that is supported on a dicing tape sheet comprising:
attaching the dicing tape sheet to a ring frame;
relatively raising a portion of the sheet supporting the wafer with respect to the ring frame; and
attaching support tape to the ring frame and the dicing tape sheet comprising attaching a plurality of chord wise extending strips of support tape to the ring frame and the dicing tape sheet.

3. A method of separating dice of a singulated wafer that is supported on a dicing tape sheet comprising:
attaching the dicing tape sheet to a ring frame;
relatively raising a portion of the sheet supporting the wafer with respect to the ring frame; and
attaching support tape to the ring frame and the dicing tape sheet comprising attaching a plurality of circumferentially extending strips of support tape to the ring frame and the dicing tape sheet.

4. A wafer processing assembly comprising:
a singulated wafer;
a dicing tape sheet having an inner portion supporting said singulated wafer thereon and having an outer portion positioned radially outwardly of said inner portion;
a ring frame attached to said outer portion of said dicing tape sheet;
a support tape attachable to said ring frame and to said dicing tape sheet;
a first operating state wherein said inner portion of said dicing tape sheet is supported by a support surface and wherein said ring frame is located at a first operating elevation about the same as the elevation of the support surface;
a second operating state wherein said ring frame is at a second operating positioned below said support surface and said dicing tape sheet is stretched and said singulated wafer is radially expanded; and
a third operating state wherein plural arcuate support tape segments are attached to said ring frame and to said outer portion of said dicing tape sheet.

5. The wafer processing assembly of claim 4 wherein said assembly has a fourth operating state wherein said ring frame is at said first operating position and said dicing tape sheet outer portion and inner portion are substantially coplanar.

6. A wafer processing assembly comprising:
a singulated wafer;
a dicing tape sheet having an inner portion supporting said singulated wafer thereon and having an outer portion positioned radially outwardly of said inner portion;
a ring frame attached to said outer portion of said dicing tape sheet;
a support tape attachable to said ring frame and to said dicing tape sheet;
a first operating state wherein said inner portion of said dicing tape sheet is supported by a support surface and wherein said ring frame is located at a first operating elevation about the same as the elevation of the support surface;
a second operating state wherein said ring frame is at a second operating positioned below said support surface and said dicing tape sheet is stretched and said singulated wafer is radially expanded; and a third operating state wherein plural radially extending support tape segments are attached to said ring frame and to said outer portion of said dicing tape sheet.

7. A wafer processing assembly comprising:
   a singulated wafer;
   a dicing tape sheet having an inner portion supporting said singulated wafer thereon and having an outer portion positioned radially outwardly of said inner portion;
   a ring frame attached to said outer portion of said dicing tape sheet;
   a support tape attachable to said ring frame and to said dicing tape sheet;
   a first operating state wherein said inner portion of said dicing tape sheet is supported by a support surface and wherein said ring frame is located at a first operating elevation about the same as the elevation of the support surface;
   a second operating state wherein said ring frame is at a second operating positioned below said support surface and said dicing tape sheet is stretched and said singulated wafer is radially expanded; and
   a third operating state wherein plural chord wise extending support tape segments are attached to said ring frame and to said outer portion of said dicing tape sheet.

8. The wafer processing assembly of claim 6 wherein said assembly has a fourth operating state wherein said ring frame is at said first operating position and said dicing tape sheet outer portion and inner portion are substantially coplanar.

9. The wafer processing assembly of claim 7 wherein said assembly has a fourth operating state wherein said ring frame is at said first operating position and said dicing tape sheet outer portion and inner portion are substantially coplanar.

* * * * *